(12) United States Patent
Yang et al.

(10) Patent No.: US 6,455,371 B1
(45) Date of Patent: Sep. 24, 2002

(54) METHOD FOR FORMING CAPACITOR OF A DRAM HAVING A WALL PROTECTION STRUCTURE

(75) Inventors: Yu-Ju Yang, Hsin-Chu; Yu-Hong Huang, Tainan; Ching-Ming Lee; Kuo-Yuh Yang, both of Hsin-Chu, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/783,867

(22) Filed: Feb. 15, 2001

(51) Int. Cl.[7] .......................................... H01L 21/8242
(52) U.S. Cl. ........................ 438/253; 438/239; 438/241
(58) Field of Search ................................ 438/253, 254, 438/241, 250, 251, 252, 255, 239

(56) References Cited

U.S. PATENT DOCUMENTS

| | | | | |
|---|---|---|---|---|
| 5,389,568 A | * | 2/1995 | Yun | 438/253 |
| 5,854,106 A | * | 12/1998 | Wu | 438/253 |
| 6,008,084 A | * | 12/1999 | Sung | 438/253 |
| 6,255,161 B1 | * | 7/2001 | Lin | 438/254 |

* cited by examiner

*Primary Examiner*—Michael Trinh
(74) *Attorney, Agent, or Firm*—Powell Goldstein Frazer & Murphy LLP

(57) ABSTRACT

The present invention provides a method for forming capacitor of a dynamic random access memory cell. The method comprises providing a substrate and the word line structures formed thereon. A first dielectric layer is deposited on the substrate and the word line structures. A first polysilicon layer is deposited to form bit line contacts and bit lines. A second dielectric layer is formed on the first dielectric layer and the bit lines. The partial second dielectric layer is removed to form at least a wall structure in the second dielectric layer. The partial second dielectric layer and partial first dielectric layer are removed to form a capacitor contact opening. A second polysilicon is deposited into the capacitor contact opening and on the wall structure and the second dielectric layer. The partial second polysilicon is removed to form a capacitor node whereby a side-wall of the capacitor node is adjacent to the wall structure.

5 Claims, 3 Drawing Sheets

METHOD FOR FORMING CAPACITOR OF A DRAM HAVING A WALL PROTECTION STRUCTURE

BACKGROUND OF THE INVENTION

1. Field of the Invention

The invention relates to DRAM, and more particularly to a capacitor of a DRAM cell.

2. Description of the Prior Art

A DRAM cell is generally constituted of a metal-oxide-semiconductor (MOS) field effect transistor and a capacitor connected to the MOS field effect transistor. With the increase of an integration density, the occupied area of each memory cell in a plan is decreased. However, the amount of storage capacitance in the limited area of a DRAM cell is very important in application. Recently, a three-dimensional structure has been proposed to provide a stacked capacitor over a bit line (COB), and to increase a height of a storage node electrode constituted of a lower plate of the stacked capacitor.

A DRAM cell with a conventional COB structure is shown in FIG. 1. A semiconductor substrate 100 is provided and thereon multitude of gate structure (word line) 120 are formed. Of course, there may be some source/drain regions and isolation device (not shown), such as field oxide, are formed in and on the semiconductor substrate 100. A tungsten silicide layer 130 is on the gate structures 120 and a first inter-polysilicon dielectric layer (IPD 1) 110 is deposited on the tungsten silicide layer 130 and the semiconductor substrate 100. A bit line structure 140 constituted of polysilicon deposited in and on the contact hole in the first inter-polysilicon dielectric layer 110 may be shown. A second inter-polysilicon dielectric layer (IPD 2) 160 is subsequently deposited on the first inter-polysilicon dielectric layer 110 and the tungsten silicide layer 150. Furthermore, a multitude of capacitor node structures 170 are constituted of polysilicon in and on the contact holds in both the first and the second inter-polysilicon layer (110 and 160).

However, those capacitor node structures 170 are so protrudent that they are susceptible to the following cleaning process and removed out. The removal of the capacitor node structures may result in damages in some characteristics.

SUMMARY OF THE INVENTION

It is an object of the present invention to provide a method of protecting the capacitor structures of a DRAM cell. The capacitor node structures in a DRAM cell are formed between multitude of wall structures constituted of inter-polysilicon layer.

It is another object of the present invention to provide a method of reducing the removal of the capacitor structures during DRAM manufacture process. The capacitor node structures can be protected from water or mega-sonic flow during cleaning steps.

In the present invention, a method for forming capacitor of a dynamic random access memory cell. The method comprises providing a substrate and the word line structures formed thereon. A first dielectric layer is deposited on the substrate and the word line structures. A first polysilicon layer is deposited to form bit line contacts and bit lines. A second dielectric layer is formed on the first dielectric layer and the bit lines. The partial second dielectric layer is removed to form at least a wall structure in the second dielectric layer. The partial second dielectric layer and partial first dielectric layer are removed to form a capacitor contact opening. A second polysilicon is deposited into the capacitor contact opening and on the wall structure and the second dielectric layer. The partial second polysilicon is removed to form a capacitor node whereby a side-wall of the capacitor node is adjacent to the wall structure.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

Figure 1:
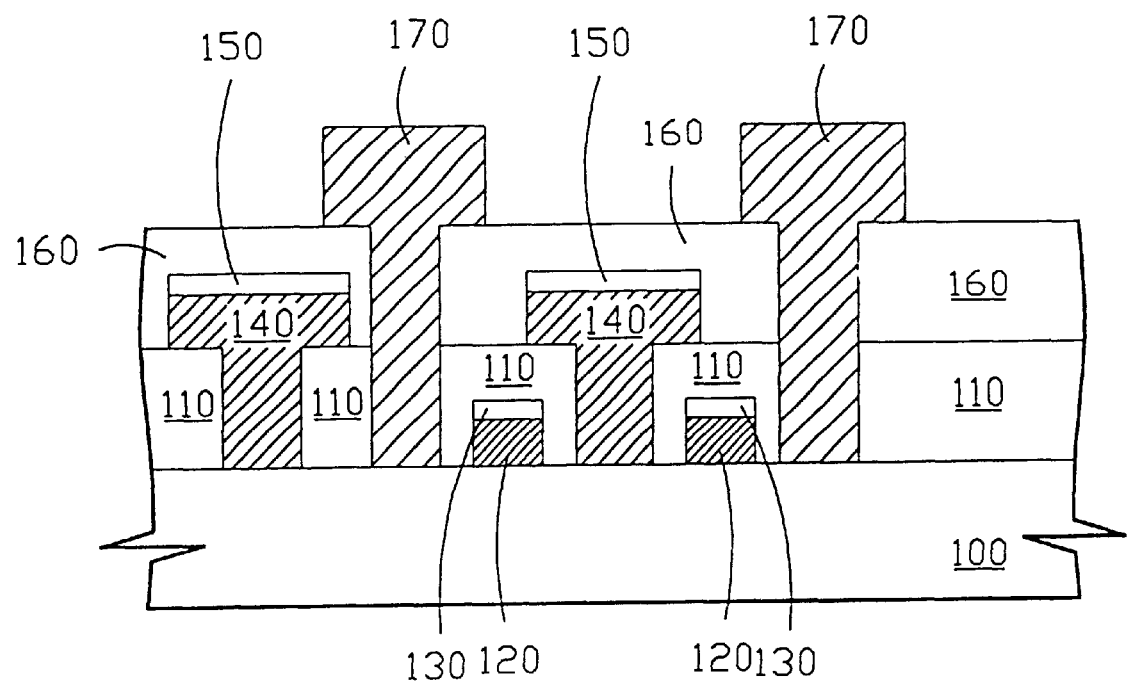
FIG. 1 is a cross-sectional schematic diagram illustrating a DRAM cell of a COB structure in accordance with the prior art.

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a method for forming a memory device comprises providing a semiconductor substrate and thereon a plurality of gate structures formed. A first dielectric layer is deposited on the semiconductor substrate and the gate structures. The first dielectric layer is then etched to form a plurality of first contact openings. Next, a first polysilicon is deposited into the first contact openings and on the first dielectric layer to form a plurality of first contacts and first conductive lines on the first dielectric layer. The first conductive lines are connected to the first contacts. Next, the second dielectric layer is etched to form at least a wall structure in the second dielectric layer. The second dielectric layer and the first dielectric layer are etched to form a second contact opening. A second polysilicon is deposited into the second opening and on the wall structure and the second dielectric layer. The second polysilicon is planarized and the second polysilicon is etched to form a second conductive node whereby a side-wall of the second conductive node is adjacent to the wall structure.

One embodiment of the present invention is depicted in FIGS. 2A–2E. Shown in FIG. 2A, a semiconductor substrate 10 is provided and thereon a multitude of devices 12, such as gate structures (word line), are formed. Of course, there may be some source/drain regions and isolation device (not shown), such as field oxide, are formed in and on the semiconductor substrate 10. A tungsten suicide layer 13 is on the gate structures 12 and then a first dielectric layer 11, such as inter-polysilicon dielectric (IPD), is deposited on the tungsten silicide layer 13 and the semiconductor substrate 10. Next, a multitude of conductive lines 14, such as bit lines, constituted of polysilicon deposited in and on the contact holes in the first dielectric layer 11 may be shown. Further, a tungsten silicide layer 15 is also formed on the conductive lines 14.

Figure 2A:
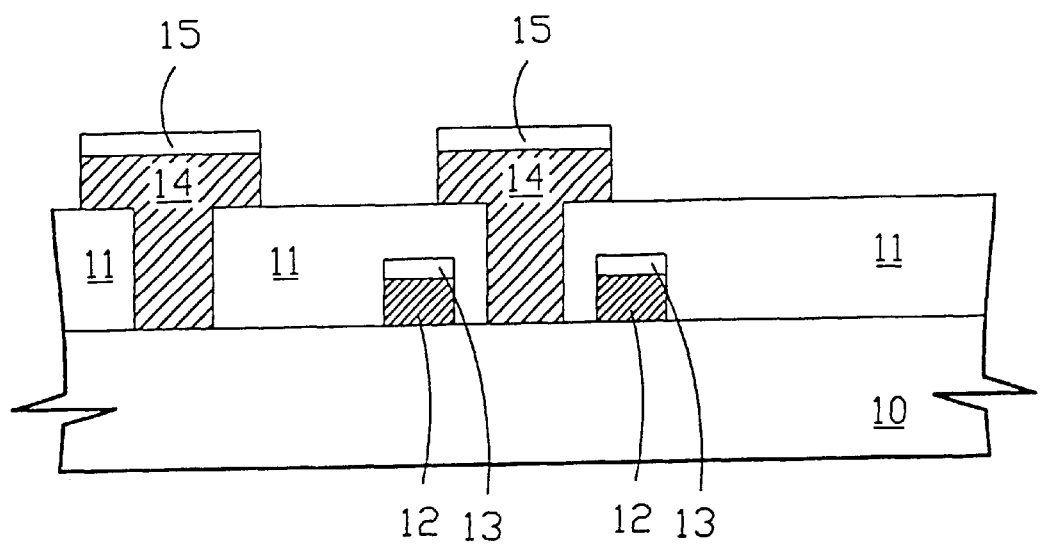
FIGS. 2A–2E are a series of cross-sectional schematic diagrams illustrating a DRAM cell of a COB structure manufactured in accordance with the present invention.
Figure 2B:
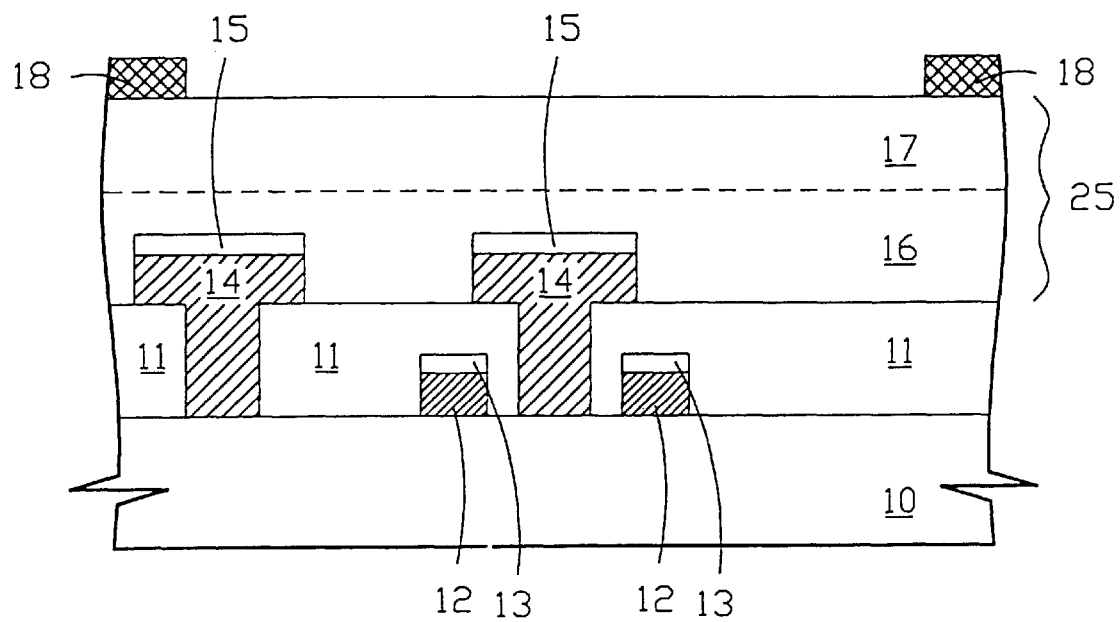

Referring to FIG. 2B, a second dielectric layer 25, such as inter-polysilicon dielectric layer, is subsequently deposited over the first dielectric layer 11 and the tungsten silicide layer 15. To be specific, in FIG. 2B, the second dielectric layer 25 is constituted of a first portion 16 and a second portion 17 for the following illustrations. In fact, the first portion 16 and the second portion 17 are the second dielectric layer 25. Next, a mask of wall structures 18 is on the second portion 17 for forming a multitude of wall structures.

Figure 2C:
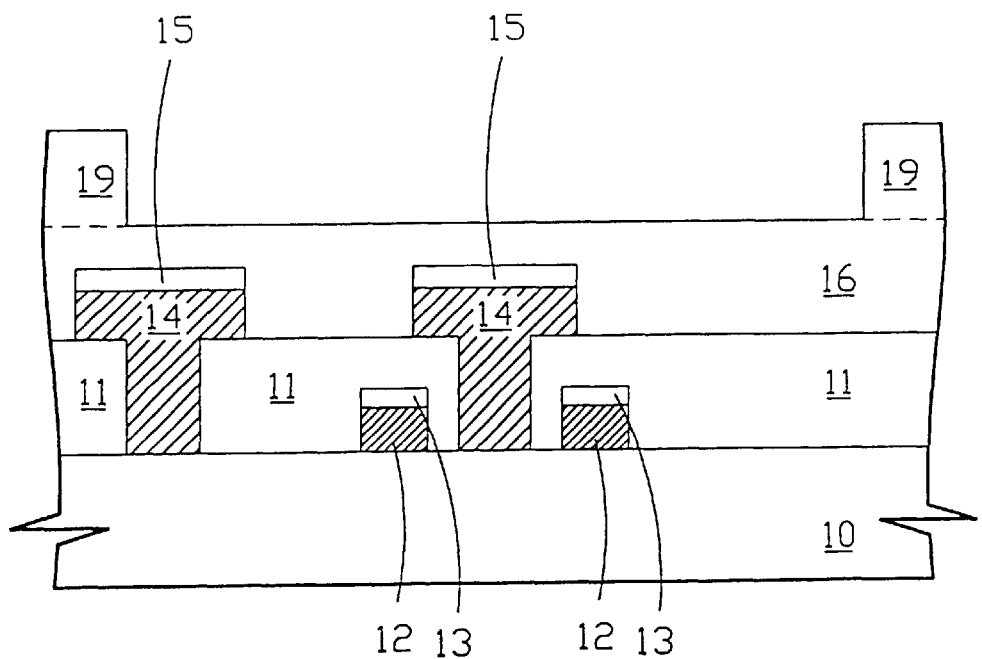
Figure 2D:
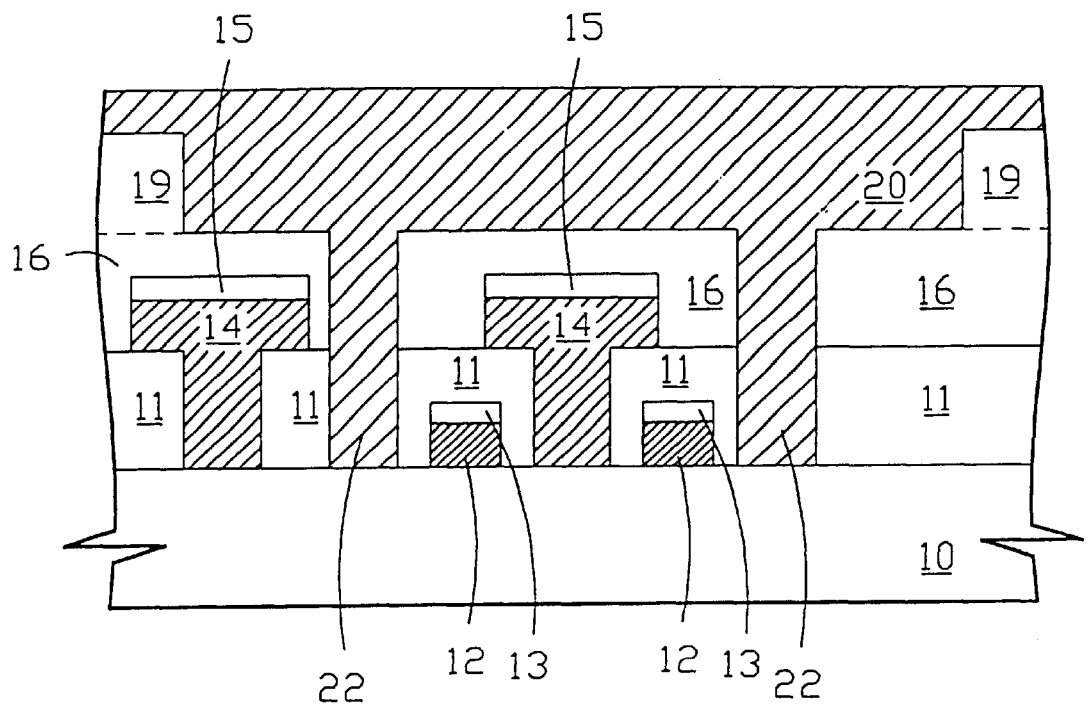

Next, as a key step of the present invention depicted in FIG. 2C, the second portion 17 of the second dielectric layer 25 are etched by using the mask of wall structures 18 as an etch mask. A multitude of wall structures 19 are remained after etch of the second portion 17. The wall structures 19 are also constituted of the second dielectric layer 25 and protruded on the first portion 16 of the second dielectric layer 25.

Next, a pattern of capacitor contacts (not shown) is first transferred on the first portion 16. Then the first portion 16 of the second dielectric layer 25 and the first dielectric layer 11 are etched to form some capacitor contact openings. Next, a polysilicon layer 20 is deposited into the capacitor contact openings, the wall structures 19, and the first portion 16 of the second dielectric layer 25 to form the capacitor contacts 22.

Figure 2E:
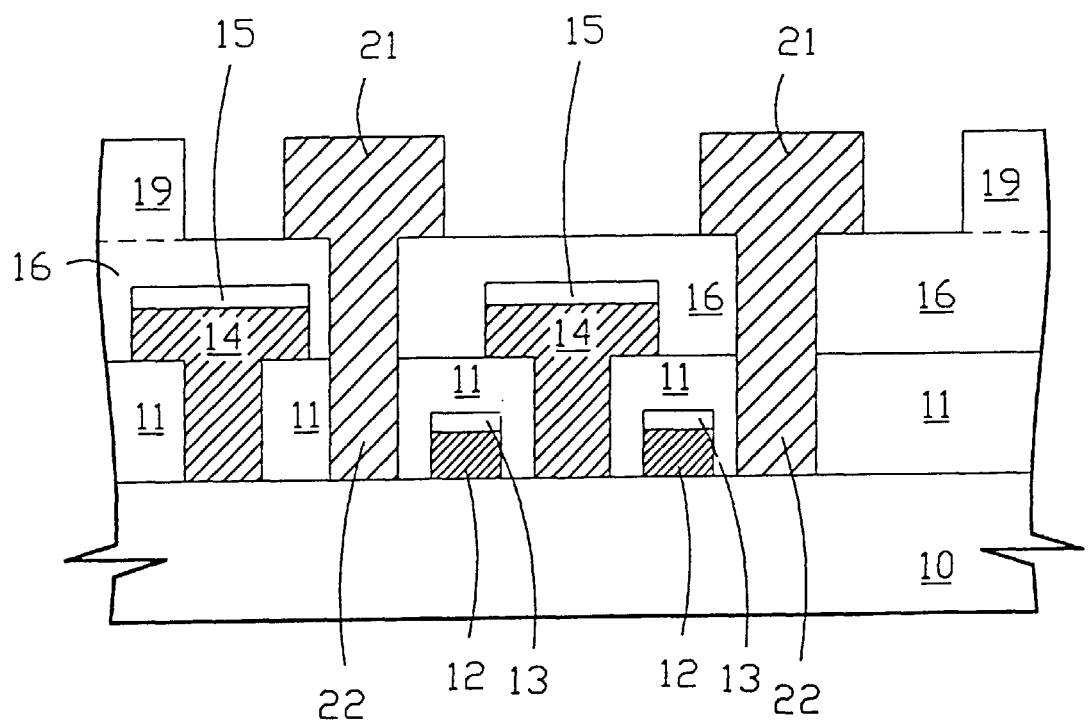

Next, referring to FIG. 2E, the polysilicon layer 20 is first planarized by the method of chemical mechanical polishing. A pattern of capacitor node structures (not shown) is transferred on the polysilicon layer 20 and thereafter the polysilicon layer 20 is etched to form multitude of capacitor node structures 21 connected to the capacitor contacts 22. To be specific, the wall structures 19 are parallel to and around the capacitor node structures 21. The wall structures 19 can protect the capacitor node structures 21 from water or mega-sonic flow during the subsequent clean step and further reduce the risk of removal of the capacitor node structures 21.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a protection structure for a capacitor of a dynamic random access memory cell, said method comprising:

providing a substrate;

forming a plurality of word line structures on said substrate;

depositing a first dielectric layer on said substrate and said word line structures;

removing partial said first dielectric layer to form a plurality of bit line contact openings;

forming a plurality of bit line structures by depositing a first polysilicon layer into said bit line contact openings and on said first dielectric layer and then depositing a tungsten silicide layer on said first polysilicon layer;

forming a second dielectric layer on said first dielectric layer and said bit line structures;

removing a portion of said second dielectric layer to form a plurality of wall structures in said second dielectric layer;

removing a portion of said second dielectric layer between said wall structures and a portion of said first dielectric layer to form a capacitor contact opening; and forming a capacitor plug and a capacitor node by depositing a second polysilicon layer into said capacitor contact opening and thereon, wherein said capacitor node is adjacent to said wall structures.

2. The method according to claim 1, wherein said word line structures comprise a tungsten silicide layer thereon.

3. The method according to claim 1, wherein said bit lines comprise a tungsten silicide layer thereon.

4. A method for forming a memory device, said method comprising:

providing a semiconductor substrate and thereon a plurality of gate structures formed;

depositing a first dielectric layer on said semiconductor substrate and said gate structures;

etching said first dielectric layer to form a plurality of first contact openings;

depositing a first polysilicon into said first contact openings and on said first dielectric layer to form a plurality of first contacts and first conductive lines on said first dielectric layer, said first conductive lines connected to said first contacts;

depositing a second dielectric layer on said first dielectric layer and said first conductive lines;

etching said second dielectric layer to form at least a wall structure in said second dielectric layer;

etching said second dielectric layer and said first dielectric layer to form a second contact opening;

depositing a second polysilicon into said second opening and on said wall structure and said second dielectric layer;

planarizing said second polysilicon; and etching said second polysilicon to form a second conductive node whereby a side wall of said second conductive node is adjacent to said wall structure.

5. The method according to claim 4, wherein said planarizing step is implemented by the method of chemical mechanical polishing.

* * * * *